United States Patent
Bae et al.

(10) Patent No.: US 7,443,681 B2
(45) Date of Patent: Oct. 28, 2008

(54) HEAT DISSIPATOR FOR DISPLAY APPARATUS AND PLASMA DISPLAY APPARATUS INCLUDING THE HEAT DISSIPATOR

(75) Inventors: Sung-Won Bae, Suwon-si (KR); Ki-Jung Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 355 days.

(21) Appl. No.: 11/328,156

(22) Filed: Jan. 10, 2006

(65) Prior Publication Data
US 2006/0163986 A1    Jul. 27, 2006

(30) Foreign Application Priority Data
Jan. 22, 2005    (KR)    .............. 10-2005-0006080

(51) Int. Cl.
 H05K 7/20    (2006.01)
 H01L 23/36    (2006.01)
(52) U.S. Cl. ............... 361/707; 361/687; 361/704; 361/717; 361/831; 174/50; 174/15.1; 174/16.3; 257/684; 257/723; 257/727; 349/56; 349/58; 349/60; 345/92; 345/168; 345/211
(58) Field of Classification Search ............... 361/681, 361/687, 704–712, 714, 715, 719, 808, 809, 361/831, 760, 767, 785, 789, 796, 799; 174/50, 174/15.1, 16.3; 349/56, 58, 60, 150, 151; 345/168, 211, 204–206, 60, 87, 104, 74, 345/80, 84–92; 257/684, 687, 584, 621, 257/729, 723, 727; 315/169.4, 167; 313/587
See application file for complete search history.

(56) References Cited

U.S. PATENT DOCUMENTS

| | | | | |
|---|---|---|---|---|
| 5,844,535 A * | 12/1998 | Itoh et al. | ............ | 345/92 |
| 6,703,702 B2 * | 3/2004 | Inoue et al. | ............ | 257/684 |
| 6,972,963 B1 * | 12/2005 | Chou | ............ | 361/760 |
| 7,075,528 B2 * | 7/2006 | Sano et al. | ............ | 345/211 |
| 7,254,031 B2 * | 8/2007 | Kim et al. | ............ | 361/717 |
| 7,282,842 B2 * | 10/2007 | Kim et al. | ............ | 313/46 |

FOREIGN PATENT DOCUMENTS

EP    1065720 A2 *    1/2001
JP    2000250425 A *    9/2000

* cited by examiner

*Primary Examiner*—Michael V Datskovskiy
(74) *Attorney, Agent, or Firm*—Robert E. Bushnell, Esq.

(57) ABSTRACT

A heat dissipator of a signal transmission member for a display apparatus can sufficiently dissipate heat from devices of the signal transmission member and protect the devices, and includes a thermal conductive supporter for dissipating heat generated by a signal transmission member, which transmits electrical signals between a chassis member supporting a panel displaying image and including at least one device and a circuit unit separated from the chassis member to drive the panel. The thermal conductive supporter includes: a base portion formed of a thermal conductive material, and having a side surface contacting the chassis member and another side surface contacting the signal transmission member; and a recess portion oriented on the base portion toward the chassis member so that the at least one device does not contact the base portion.

15 Claims, 6 Drawing Sheets

HEAT DISSIPATOR FOR DISPLAY APPARATUS AND PLASMA DISPLAY APPARATUS INCLUDING THE HEAT DISSIPATOR

CLAIMS OF PRIORITY

This application makes reference to, incorporates the same herein, and claims all benefits accruing under 35 U.S.C. §119 from an application earlier filed in the Korean Intellectual Property Office on Jan. 22, 2005 and there duly assigned Serial No. 10-2005-0006080.

BACKGROUND OF THE INVENTION

1. Field of the Invention

The present invention relates to a heat dissipator for a display apparatus, and a plasma display apparatus including the heat dissipator, and more particularly, to a heat dissipator capable of sufficiently dissipating heat generated by a device of a signal transmission member and a plasma display apparatus including the heat dissipator.

2. Description of the Related Art

Plasma display apparatuses are flat panel display displaying images using gas discharge phenomenon, and have superior displaying performances such as display capacity, brightness, contrast, residual images, and viewing angle. In addition, the plasma display apparatuses can display image on large screen with thin thickness, and thus, are considered as next generation flat panel display.

In general, the plasma display apparatus includes a plasma display panel, a chassis member, a circuit unit, and a case. The chassis member is disposed parallel to the plasma display panel displaying the image. The circuit unit is disposed on a rear portion of the chassis member to drive the plasma display panel. The plasma display panel, the chassis member, and the circuit unit are received in the case.

In the plasma display apparatus, the circuit unit and the plasma display panel are electrically connected to each other by a signal transmission unit such as a Tape Carrier Package (TCP) or a Chip on Film (COF) to drive the panel. The TCP or COF is widely used since it is flexible and a lot of devices can be mounted thereon, and thus, the size of circuit unit can be reduced.

A boss is conventionally used to attach the signal transmission unit to the chassis member. A boss is installed on a rear surface of the chassis member included in a plasma display apparatus, and a hole is formed on a portion of the signal transmission unit corresponding to the boss, and thus, a screw can be attached to the boss while penetrating through the hole, and the signal transmission unit can be supported by the chassis member.

In addition, devices mounted on the signal transmission unit are exposed to the air between the signal transmission unit and the chassis member so that the heat generated by the mounted devices moves to the air in the opened space. Then, the air heated by the device moves upward due to convection, and the heat can be naturally dissipated.

However, in the signal transmission unit, such as a TCP or COF, heat is generated by the devices mounted on the signal transmission unit when the plasma display panel is driven, and it is not sufficient to dissipate the heat from the devices mounted on the signal transmission unit to the outside by air convection.

When the heat cannot be dissipated sufficiently, the devices can operate improperly, and thus, the image displaying of the panel can be defective. Especially, if the plasma display panel is driven in a High Definition (HD) single scan mode, more heat is generated by the devices mounted on the TCP or COF connecting an address driving unit to the address electrodes of the circuit unit. Therefore, a unit for effectively dissipating the heat generated by these devices is required.

The amount of heat generated by the devices mounted on the signal transmission unit can be reduced. However, this may degrade the image quality of the PDP. Particularly in the HD PDP, the image quality degradation can be readily apparent to a user, and the problem becomes worse. Therefore, there is a limitation to reducing the amount of heat generated by the devices.

In addition, electromagnetic waves are generated by the devices mounted on the signal transmission member, and these electromagnetic waves are harmful to human beings.

SUMMARY OF THE INVENTION

The present invention provides a heat dissipator for a signal transmission unit capable of sufficiently dissipating heat from devices mounted on the signal transmission unit and protecting the devices, and a plasma display apparatus including the heat dissipator.

The present invention also provides a heat dissipator for a signal transmission unit of a display apparatus, wherein the heat dissipator can shield electromagnetic waves generated by devices mounted on the signal transmission unit, and a plasma display apparatus including the heat dissipator.

According to one aspect of the present invention, a heat dissipator for a display apparatus is provided, the heat dissipator including: a signal transmission member; a thermal conductive supporter adapted to dissipate heat generated by the signal transmission member; a chassis member adapted to support a panel adapted to display images and including at least one device; and a circuit unit separated from the chassis member and adapted to drive the panel. The signal transmission member is adapted to transmit electrical signals between the chassis member and the circuit unit; and the thermal conductive supporter includes: a base portion of a thermal conductive material, and having a side surface adapted to contact the chassis member and another side surface adapted to contact the signal transmission member; and a recess portion arranged on the base portion and oriented toward the chassis member so that the at least one device does not contact the base portion.

A thermal conductivity of the thermal conductive supporter is preferably at least 10 W/mK. An electrical insulating property of the thermal conductive supporter is preferably a maximum of 105 ohm·cm.

The apparatus preferably further includes a screw adapted to attach the thermal conductive supporter to the signal transmission member. The apparatus preferably further includes a number of thermal conductive supporters and a number of signal transmission members, the number of thermal conductive supporters being in a one-to-one correspondence with the number of signal transmission members. The apparatus preferably further includes a plurality of signal transmission members, the thermal conductive supporter being arranged along a direction of the chassis member and adapted to simultaneously support the plurality of signal transmission members.

The recess portion is preferably arranged in a vertical direction of the base portion to facilitate heat generated by a device mounted on the signal transmission member to move upward through a space between the recess portion and the device.

According to another aspect of the present invention, a plasma display apparatus is provided including: a plasma display panel adapted to display images and including at least one device; a chassis member arranged on a surface of the plasma display panel and adapted to support the plasma display panel; a circuit unit arranged on a surface of the chassis member and adapted to drive the plasma display panel; at least one signal transmission member separated from the chassis member and adapted to transmit electrical signals between the plasma display panel and the circuit unit; and a thermal conductive supporter adapted to support the signal transmission member, the thermal conductive supporter including: a base portion of a thermal conductive material, and having a side surface adapted to contact the chassis member and another side surface adapted to contact the signal transmission member; and a recess portion arranged on the base portion and oriented toward the chassis member so that the at least one device does not contact the base portion.

A thermal conductivity of the thermal conductive supporter is preferably at least 10 W/mK. An electrical insulating property of the thermal conductive supporter is preferably a maximum of 105 ohm·cm.

The apparatus preferably further includes a screw adapted to attach the thermal conductive supporter to the signal transmission member. The apparatus further preferably includes a number of thermal conductive supporters and a number of signal transmission members, the number of thermal conductive supporters being in a one-to-one correspondence with the number of signal transmission members. The apparatus preferably further includes a plurality of signal transmission members, the thermal conductive supporter being arranged along a direction of the chassis member and adapted to simultaneously support the plurality of signal transmission members.

The recess portion is preferably arranged in a vertical direction of the base portion to facilitate heat generated by a device mounted on the signal transmission member to move upward through a space between the recess portion and the device.

The plasma display panel preferably includes: a front substrate; a rear substrate separated from the front substrate to define a discharge space with the front substrate; barrier ribs arranged between the front substrate and the rear substrate to define discharge cells with the front and rear substrates; pairs of sustain electrodes extending in one direction and respectively arranged in the discharge cells; address electrodes arranged in the discharge cells, and extending in a direction crossing the sustain electrode pairs; and phosphor layers arranged in the discharge cells.

The thermal conductive supporter is preferably adapted to support the at least one signal transmission member electrically connecting the address electrodes and an address driver of the circuit unit.

The at least one signal transmission member preferably includes a Tape Carrier Package (TCP) including an address driving Integrated Circuit (IC).

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
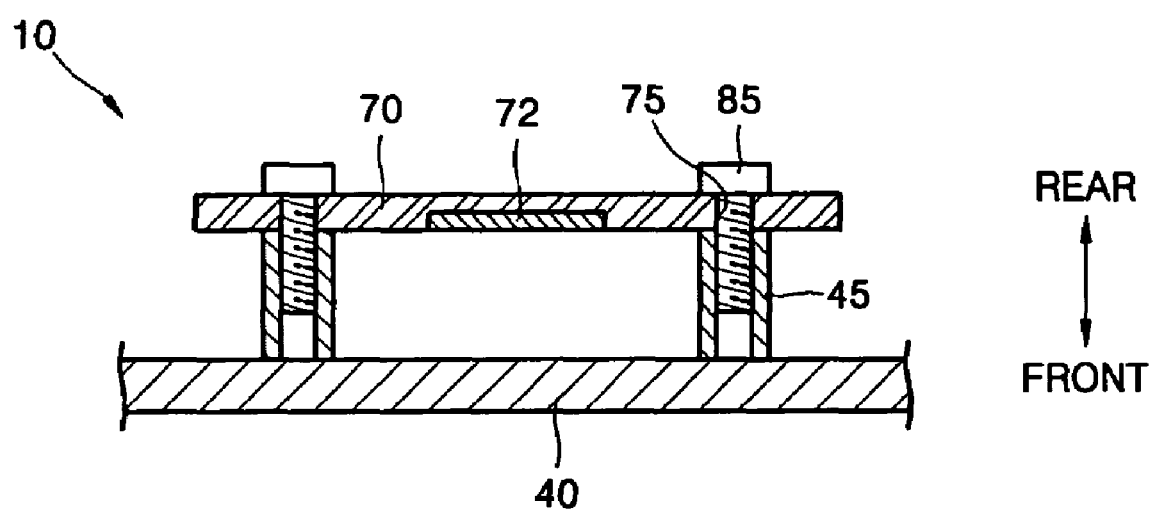
FIG. 1 is a cross-sectional view of a heat dissipator of a signal transmission unit for a display apparatus.

Referring to FIG. 1, a boss 45 is installed on a rear surface of the chassis member 40 included in a plasma display apparatus 10, and a hole 75 is formed on a portion of the signal transmission unit 70 corresponding to the boss 45, and thus, a screw 85 can be attached to the boss 45 while penetrating through the hole 75, and the signal transmission unit 70 can be supported by the chassis member 40.

In addition, devices 72 mounted on the signal transmission unit 70 are exposed to the air between the signal transmission unit 70 and the chassis member 40 so that the heat generated by the mounted devices 72 moves to the air in the opened space. Then, the air heated by the device 72 moves upward due to convection, and the heat can be naturally dissipated.

However, in the signal transmission unit 70 such as a Tape Carrier Package (TCP) or Chip on Film (COF), heat is generated by the devices 72 mounted on the signal transmission unit 70 when the plasma display panel is driven, and it is not sufficient to dissipate the heat from the devices 72 mounted on the signal transmission unit 70 to the outside by air convection.

When the heat cannot be dissipated sufficiently, the devices 72 can operate improperly, and thus, the image displaying of the panel can be defective. Especially, if the plasma display panel is driven in a High Definition (HD) single scan mode, more heat is generated by the devices mounted on the TCP or COF connecting an address driving unit to the address electrodes of the circuit unit. Therefore, a unit for effectively dissipating the heat generated by these devices is required.

The amount of heat generated by the devices mounted on the signal transmission unit can be reduced. However, this may degrade the image quality of the Plasma Display Panel (PDP). Particularly in the HD PDP, the image quality degradation can be readily apparent to a user, and the problem becomes worse. Therefore, there is a limitation to reducing the amount of heat generated by the devices.

In addition, electromagnetic waves are generated by the devices 72 mounted on the signal transmission member 70, and these electromagnetic waves are harmful to human beings.

Figure 2:
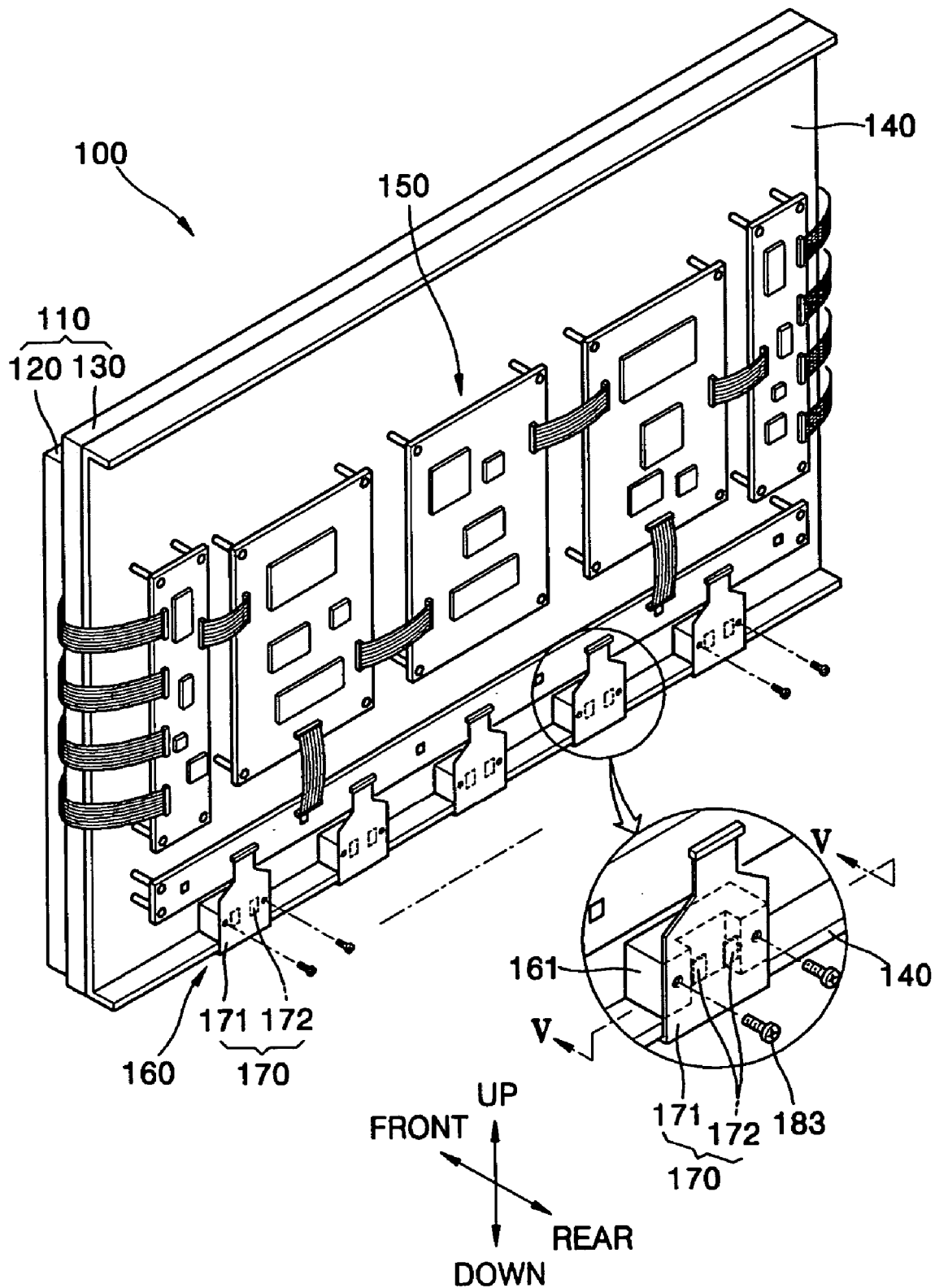
FIG. 2 is a perspective view of a heat dissipator of a signal transmission unit for a display apparatus and a plasma display apparatus including the heat dissipator according to an embodiment of the present invention.
Figure 3:
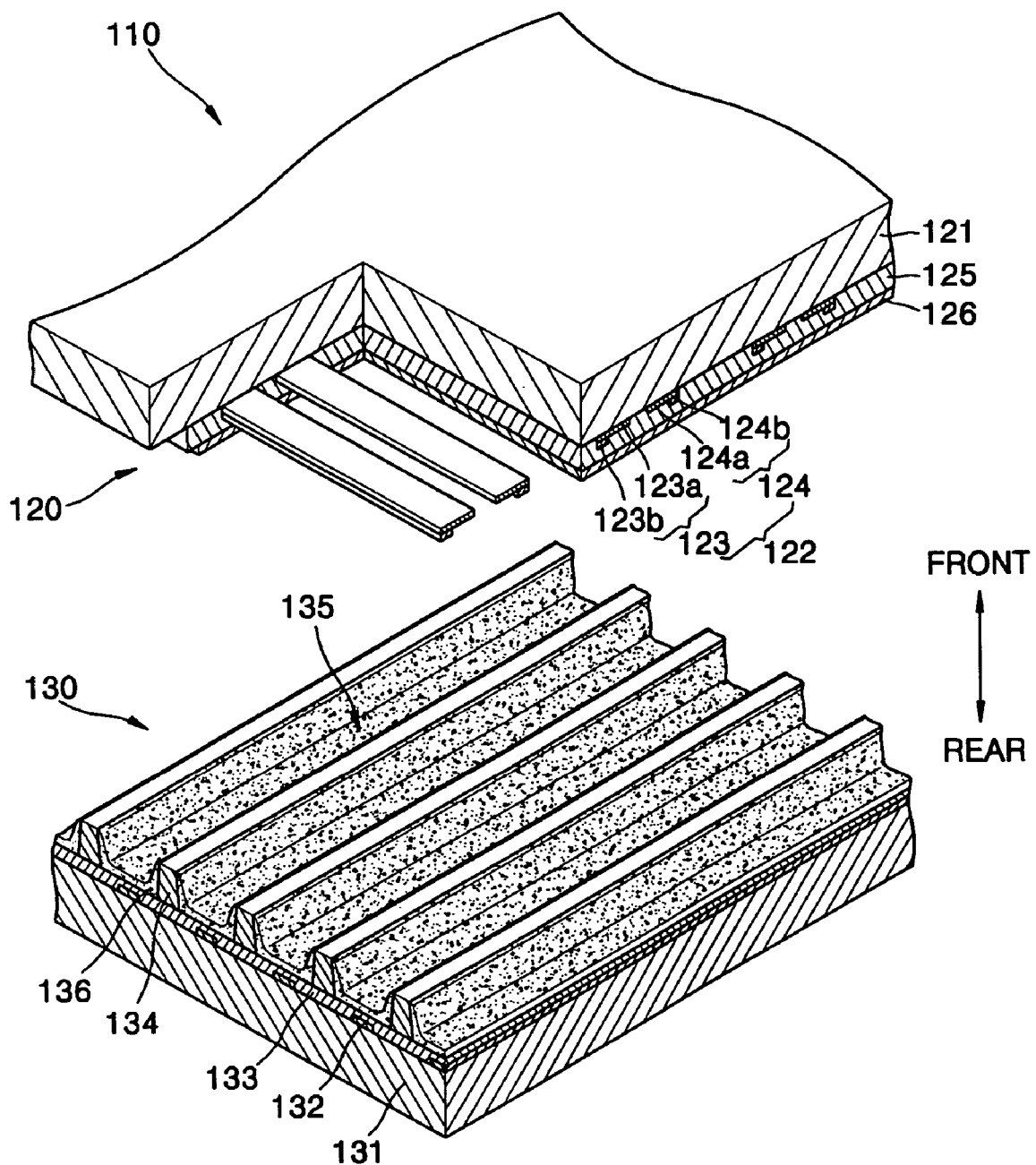
FIG. 3 is a perspective view of a part of a plasma display panel of FIG. 2.

FIG. 2 is a perspective view of a heat dissipator 160 of a signal transmission unit of a display apparatus and a plasma display apparatus 100 including the heat dissipator 160 according to an embodiment of the present invention, and FIG. 3 is a perspective view of a part of a plasma display panel of FIG. 2.

Referring to FIGS. 2 and 3, the heat dissipator 160 according to an embodiment of the present invention includes a thermal conductive supporter 161. The thermal conductive supporter 161 supports a signal transmission member 170 onto a chassis member 140, and dissipates heat generated by devices 172 mounted on the outside of the signal transmission member 170.

The chassis member 140 is formed of aluminum and is disposed on a rear portion of the panel 110 to support the panel 110 and to dissipate the heat generated by the panel 110 to the outside. Edges of the chassis member 140 can be bent toward the rear portion so as to prevent bending distortion.

The panel 110 can be various kinds of panels, for example, the panel 110 can be a Plasma Display Panel (PDP). In the present embodiment, the panel 110 is PDP. FIG. 3 is a view of an example of an Alternating Current (AC) PDP having a three-electrode surface discharge structure.

Referring to FIG. 3, the PDP 110 includes a front panel 120, a rear panel 130 facing to be coupled to the front panel 120, pairs of sustain discharge electrodes 122, address electrodes 132, and a phosphor layer 136.

In more detail, the front panel 120 includes a front substrate 121 disposed at the front portion, and sustain discharge electrode pairs 122, each of which includes an X electrode 123 and a Y electrode 124, formed on a rear surface of the front substrate 121 and disposed at the locations of discharge cells. The X electrode 123 and the Y electrode 124 forming the sustain discharge electrode pair 122 are respectively a common electrode and a scan electrode, and are separated from each other by a discharge gap. In addition, the X electrode 123 can include a transparent X electrode 123a and a bus X electrode 123b connected to the transparent X electrode 123a, and the Y electrode 124 also can include a transparent Y electrode 124a and a bus Y electrode 124b connected to the transparent Y electrode 124b.

The rear panel 130 includes a rear substrate 131 separated from the rear portion of the front substrate 121 to form a discharge space 135 between the front and rear substrates 121, and address electrodes 132 formed on a front surface of the rear substrate 131 and extending in a direction of crossing the sustain electrode pairs 122. The phosphor layer 136 is formed in the discharge space 135.

The sustain electrode pairs 122 can be covered by a front dielectric layer 125, and a protective layer 126 can be formed on a rear surface of the front dielectric layer 125. In addition, the address electrodes 132 can be covered by a rear dielectric layer 133, and a barrier rib 134 formed on the rear dielectric layer 133.

Referring to FIG. 2, the circuit unit 150 is disposed on a rear surface of the chassis member 140. The circuit unit 150 can includes a plurality of circuit boards such as a logic substrate, a power substrate, and a logic buffer substrate, and drives the panel 110.

The circuit unit 150 includes a signal transmission member 170 for transmitting electrical signals to the panel 110. The signal transmission member 170 can be a flexible circuit board such as a TCP or a COF. The signal transmission member 170 can be packaged by mounting at least one device 172 on a wiring unit 171 of tape shape.

When the TCP is used as the signal transmission member 170, the wiring unit 171 is formed by stacking a film layer, a copper thin layer formed of a copper, and a solder resist layer, and the devices 172 are mounted on the wiring unit 171. Since the TCP is formed as a tape form, the TCP has the flexibility and a size of the circuit unit can be reduced by mounting a lot of devices thereon.

In addition, the circuit unit 150 and the chassis member 140 is separated by a gap about 6 mm or larger in order to satisfy safety conditions such as a UL standard. Accordingly, the signal transmission member 170 connected to the circuit unit 150 also should have a predetermined gap with the chassis member 140. Therefore, if there is no supporting member for supporting the signal transmission member 170, the signal transmission member 170 can be swayed easily and damaged by external shock, and noise can occur on the screen. Thus, an element to support the signal transmission member 170 to the chassis member 140.

The devices 172 mounted on the signal transmission member 170 generates heat during the driving of the panel 110, and the heat degrades the display performance of the panel 110 and reduces the reliability of the circuit unit 150 when the panel 110 is driven for a long time. Therefore, an element for dissipating the heat generated by the devices 172 is required.

In the present invention, a thermal conductive supporter 161 is used to support the signal transmission member 170 onto the chassis member 140 and to sufficiently dissipate the heat generated by the devices to the outside. The thermal conductive supporter 161 is attached to the rear surface of the chassis member 140, and has a height of 6 mm or more so as to support the signal transmission member 170. The signal transmission member 170 and the thermal conductive supporter 161 can be attached to each other by screws 183.

Moreover, a portion of the thermal conductive supporter 161 corresponding to the devices 172 is hollowed so as to not directly contact the devices 172, and is formed of a material having a high thermal conductivity in order to transfer the heat of the signal transmission member 170 to the chassis base 140.

Figure 4:
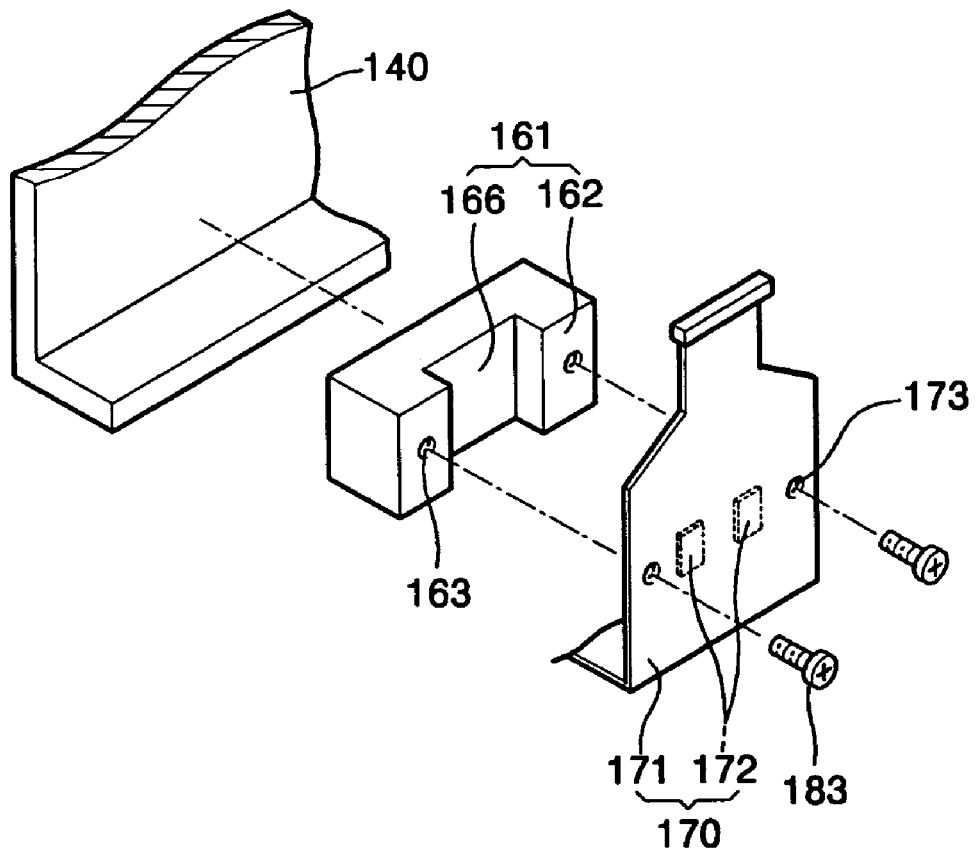
FIG. 4 is an exploded perspective view of expanded heat dissipator for the signal transmission unit of FIG. 2.
Figure 5:
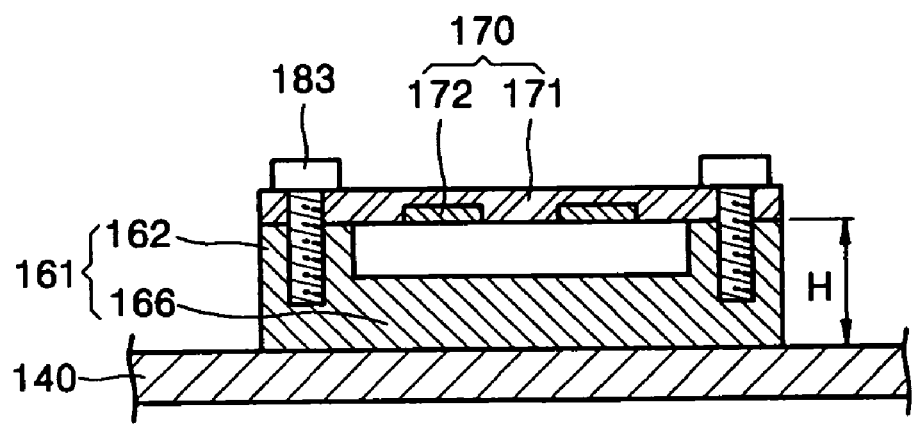
FIG. 5 is a cross-sectional view of the heat dissipator taken along line V-V of FIG. 2.

Referring to FIGS. 4 and 5, the thermal conductive supporter 161 includes a base portion 162, and a recess portion 166. A front surface of the base portion 162 is attached to the chassis member 140, and the base portion 162 has a predetermined thickness H to support the signal transmission member 170. The base portion 162 and the signal transmission member 170 can be attached to each other by screws. For example, a threaded screw hole 163 is formed on the base portion 162, and a screw clearance hole 173 is formed on a portion of the signal transmission unit corresponding to the threaded screw hole 163. Therefore, a screw 183 is screwed into the threaded screw hole 163 after passing through the screw clearance hole 173, and thus, the signal transmission member 170 can be simply attached to the thermal conductive supporter 161.

The recess portion 166 is formed to be concave including the portion corresponding to the devices 172. Therefore, the devices 172 can be separated from the thermal conductive supporter 161, and the heat generated by the devices 172 can be radiated through convection.

In addition, in order to radiate the heat of the devices 172 and move the air heated by the devices 172 upward by convection, it is desirable that the recess portion 166 is formed in a vertical direction of the base portion 162. That is, it is desirable that the heat generated by the devices 172 moves upward along the space between the devices 172 and the recess portion 166.

In addition, the heat transferred from the devices 172 or generated by the signal transmission member 170 is transferred to the chassis member 140 through the base portion 162 of the thermal conductive supporter 161. Since the chassis member 140 is formed of a material having superior thermal dissipating property, can dissipate the heat generated by the devices 170. Therefore, it is desirable that the thermal transmittance of the thermal conductive supporter 161 is at least 10 W/mK.

Moreover, the thermal conductive supporter 161 can have a low electrical insulating property, and thus, ElectroMagnetic Interference (EMI) generated by the devices 172 of the signal transmission unit 161 can be absorbed by the thermal conductive supporter 161. The electrical insulating property of the thermal conductive supporter 161 is preferably 105 ohm·cm or less. In addition, the thermal conductive supporter 161, the chassis member 140, and the screw 183 can be formed of metal so that the thermal conductive supporter 161 can be grounded onto the chassis member 140 in order to shield the EMI.

For the low electrical insulating property and high thermal conductivity, the thermal conductive supporter 161 can be formed of aluminum, steel, or copper. The present invention is not limited to the above materials, and the thermal conductive supporter 161 can be formed of any other material if it has the above thermal conductivity and the electrical insulating property, such as a plastic.

The thermal conductive supporter 161 can be formed in one-to-one correspondence with the signal transmission member 170. In this case, the thermal conductive supporter 161 is disposed at the portion corresponding to the signal transmission member 170, and thus, the total weight of the display apparatus can be reduced.

Figure 6:
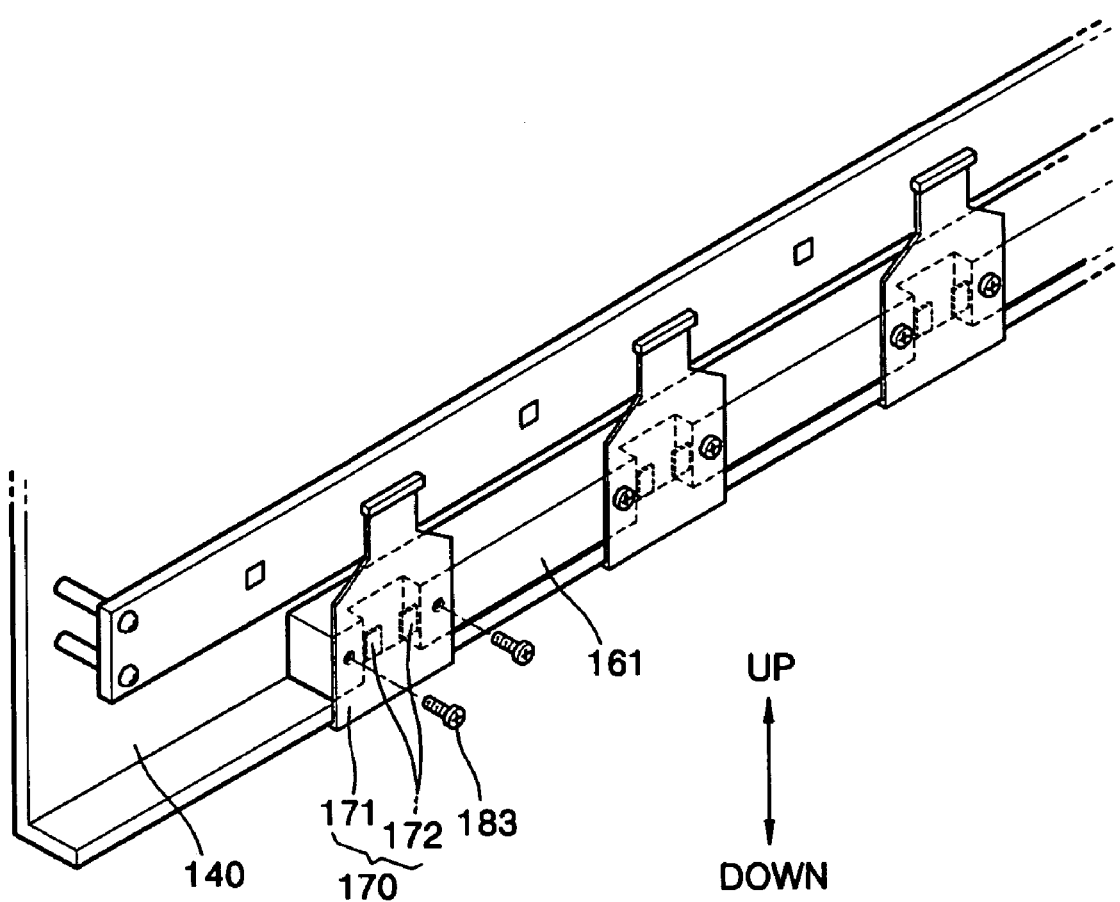
FIG. 6 is a perspective view of a modified example of the heat dissipator for the signal transmission unit of FIG. 5.

Referring to FIG. 6, the thermal conductive supporter 161 can be disposed along a direction of the chassis member 140 to support two or more signal transmission members 170. The general display apparatus has horizontal sides longer than the vertical sides, and thus, the chassis member also has longer horizontal sides than the vertical sides. Therefore, when the thermal conductive supporter 161 is installed on the horizontal direction of the chassis member 140, the strength of the chassis member 140 can be reinforced.

Moreover, although it is not shown in the drawings, a thermal conductive member can be disposed at a rear portion of the device 172 mounted on the signal transmission member 170. The thermal conductive member is formed of a material having a high thermal conductivity, such as aluminum, and contacts the device 172. In this case, the thermal conductive member can be attached to the signal transmission member 170 with the screws 183.

Figure 7:
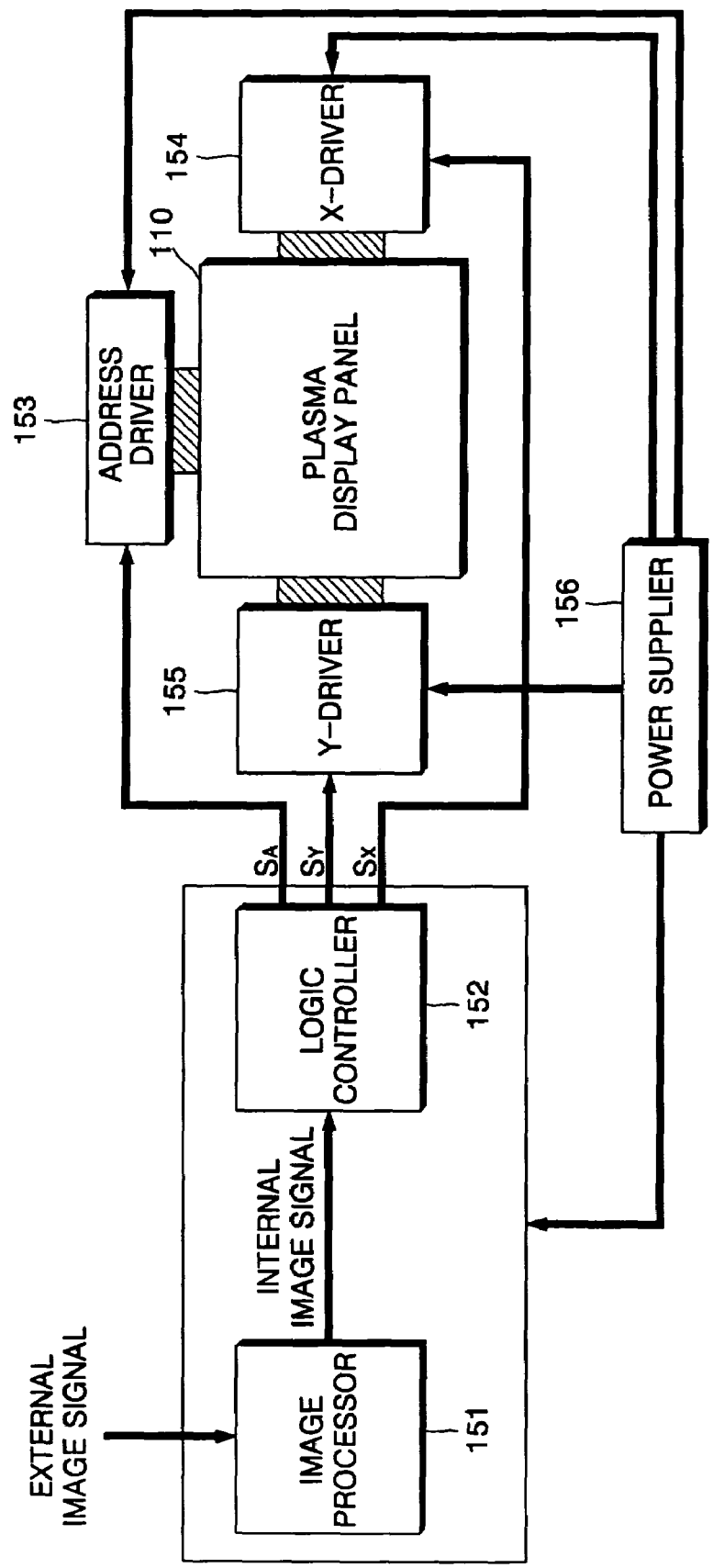
FIG. 7 is a block diagram of a circuit unit of FIG. 2.

FIG. 7 illustrates the circuit unit of the plasma display panel of FIG. 3. Referring to FIGS. 3 and 7, the circuit unit 150 can include an image processor 151, a logic controller 152, an address driver 153, an X driver 154, a Y driver 155, and a power supplier 156.

The image processor 151 converts an external analog image signal into a digital signal to generate internal image signals, for example, red, green, and blue 8 bit image data, a clock signal, a vertical synchronization signal, and a horizontal synchronization signal. The logic controller 152 generates driving control signals $S_A$, $S_Y$, and $S_X$ according to the internal image signal from the image processor 151. The address driver 153 processes an address signal $S_A$ from among the driving control signals $S_A$, $S_Y$, and $S_X$ from the logic controller 152 to generate a display data signal, and supplies the generated display data signal to the address electrodes 132. The X driver 154 processes an X driving control signal $S_X$ from among the driving control signals $S_A$, $S_Y$, and $S_X$ from the logic controller 152 and supplies the signal to the X electrodes 123. The Y driver 155 processes a Y driving control signal $S_Y$ from among the driving control signals $S_A$, $S_Y$, and $S_X$ from the logic controller 152 and supplies the signal to the Y electrodes 124.

In addition, the power supplier 156 generates an operational voltage required by the image processor 151 and the logic controller 152, and an operational voltage required by the address driver 153, the X driver 154, and the Y driver 155, and supplies these voltages to them.

The circuit unit 150 including the above structures is received by a case (not shown) including a front cover and a back cover with the PDP 110 and the chassis member 140, to form the plasma display apparatus 100.

In addition, the signal transmission members 170 that are arranged on the lower portion of the chassis member 140 and separated from each other at predetermined intervals are electrically connected between the address electrodes 132 and the address driver 153 so as to drive the PDP 110 in an HD single scan mode.

That is, referring to FIGS. 2 and 7, the wiring units 171 of the signal transmission units 170 pass through the lower edge of the chassis member 140. One end portion of each wiring unit 171 is connected to the address electrode 132 (refer to FIG. 3) disposed on the Plasma Display Panel 110, and the other end portion is connected to the address driver 153 of the circuit unit 150. In addition, at least one device 172, such as an address driving integrated circuit (IC), is mounted on the wiring unit 171 of the signal transmission unit 170, and the device 172 is disposed on a rear edge of the chassis member 140.

The thermal conductive supporter 161 can be disposed to support the signal transmission members 170 that electrically connect the address electrodes 132 (refer to FIG. 3) to the address driver 153 of the circuit unit 150.

If the PDP 110 is driven in the HD signal scan mode, the devices 172 mounted on the signal transmission units 170 connecting between the address drivers 153 of the circuit unit 150 and the address electrodes 132 (refer to FIG. 3) generate much more heat. Therefore, it is desirable that the thermal conductive supporter 161 supports the signal transmission member 170 that electrically connects the address electrode 132 (refer to FIG. 3) in the PDP 110 and the address driver 153 of the circuit unit.

According to the present invention, the thermal conductive supporter having a superior thermal conductivity supports the signal transmission member, and the portion of the thermal conductive supporter corresponding to the device mounted on the signal transmission member is separated from the device, and thus, the signal transmission member can be supported safely and the heat dissipation of the device can be sufficiently performed by the thermal conduction and air convection.

Moreover, since the thermal conductive supporter supporting the signal transmission member has a high electrical conductivity, the EMI generated by the devices mounted on the signal transmission member can be absorbed and shielded. Consequently, the operational reliability of the devices can be ensured.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A heat dissipator for a display apparatus, the heat dissipator comprising:
   a signal transmission member;
   a thermal conductive supporter adapted to dissipate heat generated by the signal transmission member;
   a chassis member adapted to support a panel adapted to display images and including at least one device; and
   a circuit unit separated from the chassis member and adapted to drive the panel;

wherein the signal transmission member is adapted to transmit electrical signals between the chassis member and the circuit unit; and wherein the thermal conductive supporter includes:
- a base portion of a thermal conductive material, and having a side surface adapted to contact the chassis member and another side surface adapted to contact the signal transmission member; and
- a recess portion arranged on the base portion and oriented toward the chassis member so that the at least one device does not contact the base portion, the recess portion being arranged in a vertical direction of the base portion to facilitate heat generated by a device mounted on the signal transmission member to move upward through a space between the recess portion and the device.

2. The apparatus of claim 1, wherein a thermal conductivity of the thermal conductive supporter is at least 10 W/mK.

3. The apparatus of claim 1, wherein an electrical insulating property of the thermal conductive supporter is a maximum of 105 ohm·cm.

4. The apparatus of claim 1, further comprising a screw adapted to attach the thermal conductive supporter to the signal transmission member.

5. The apparatus of claim 1, further comprising a number of thermal conductive supporters and a number of signal transmission members, wherein the number of thermal conductive supporters is in a one-to-one correspondence with the number of signal transmission members.

6. The apparatus of claim 1, further comprising a plurality of signal transmission members, wherein the thermal conductive supporter is arranged along a direction of the chassis member and adapted to simultaneously support the plurality of signal transmission members.

7. A plasma display apparatus, comprising:
- a plasma display panel adapted to display images and including at least one device;
- a chassis member arranged on a surface of the plasma display panel and adapted to support the plasma display panel;
- a circuit unit arranged on a surface of the chassis member and adapted to drive the plasma display panel;
- at least one signal transmission member separated from the chassis member and adapted to transmit electrical signals between the plasma display panel and the circuit unit; and
- a thermal conductive supporter adapted to support the signal transmission member, the thermal conductive supporter including:
  - a base portion of a thermal conductive material, and having a side surface adapted to contact the chassis member and another side surface adapted to contact the signal transmission member; and
  - a recess portion arranged on the base portion and oriented toward the chassis member so that the at least one device does not contact the base portion, the recess portion being arranged in a vertical direction of the base portion to facilitate heat generated by a device mounted on the signal transmission member to move upward through a space between the recess portion and the device.

8. The apparatus of claim 7, wherein a thermal conductivity of the thermal conductive supporter is at least 10 W/mK.

9. The apparatus of claim 8, wherein an electrical insulating property of the thermal conductive supporter is a maximum of 105 ohm·cm.

10. The apparatus of claim 7, further comprising a screw adapted to attach the thermal conductive supporter to the signal transmission member.

11. The apparatus of claim 7, further comprising a number of thermal conductive supporters and a number of signal transmission members, wherein the number of thermal conductive supporters is in a one-to-one correspondence with the number of signal transmission members.

12. The apparatus of claim 7, further comprising a plurality of signal transmission members, wherein the thermal conductive supporter is arranged along a direction of the chassis member and adapted to simultaneously support the plurality of signal transmission members.

13. The apparatus of claim 7, wherein the plasma display panel comprises:
- a front substrate;
- a rear substrate separated from the front substrate to define a discharge space with the front substrate;
- barrier ribs arranged between the front substrate and the rear substrate to define discharge cells with the front and rear substrates;
- pairs of sustain electrodes extending in one direction and respectively arranged in the discharge cells;
- address electrodes arranged in the discharge cells, and extending in a direction crossing the sustain electrode pairs; and
- phosphor layers arranged in the discharge cells.

14. The apparatus of claim 13, wherein the thermal conductive supporter is adapted to support the at least one signal transmission member electrically connecting the address electrodes and an address driver of the circuit unit.

15. The apparatus of claim 13, wherein the at least one signal transmission member comprises a Tape Carrier Package (TCP) including an address driving Integrated Circuit (IC).

* * * * *